US012650467B2

(12) United States Patent
Khawas et al.

(10) Patent No.: US 12,650,467 B2
(45) Date of Patent: Jun. 9, 2026

(54) CLOCK GATING CIRCUITS AND METHODS FOR DUAL-EDGE-TRIGGERED APPLICATIONS

(71) Applicant: TEXAS INSTRUMENTS INCORPORATED, Dallas, TX (US)

(72) Inventors: Arnab Khawas, Bangalore (IN); Gokul Sabada, Bangalore (IN); Madhavan Sainath Rao Pissay, Hyderabad (IN); Badarish Subbannavar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 73 days.

(21) Appl. No.: 18/908,311

(22) Filed: Oct. 7, 2024

(65) Prior Publication Data

US 2025/0027995 A1 Jan. 23, 2025

Related U.S. Application Data

(63) Continuation of application No. 18/308,486, filed on Apr. 27, 2023, now Pat. No. 12,146,912.

(51) Int. Cl.
*G01R 31/3185* (2006.01)
*G01R 31/317* (2006.01)
(52) U.S. Cl.
CPC .............. *G01R 31/318552* (2013.01); *G01R 31/31724* (2013.01); *G01R 31/31727* (2013.01)
(58) Field of Classification Search
CPC ...... G01R 31/318552; G01R 31/31724; G01R 31/31727
See application file for complete search history.

(56) References Cited

U.S. PATENT DOCUMENTS

| | | | |
|---|---|---|---|
| 8,587,338 B1 | 11/2013 | Rosen | |
| 2006/0061400 A1 | 3/2006 | Tschanz et al. | |
| 2009/0309566 A1* | 12/2009 | Shiu | H02M 3/07 323/283 |
| 2011/0156752 A1* | 6/2011 | Sofer | H03K 19/0016 326/52 |
| 2015/0316950 A1 | 11/2015 | Dey et al. | |

(Continued)

OTHER PUBLICATIONS

International Search report for PCT/US2023/086301, dated Apr. 23, 2024.

*Primary Examiner* — Thien Nguyen
(74) *Attorney, Agent, or Firm* — Michelle F. Murray; Frank D. Cimino

(57) ABSTRACT

Embodiments disclosed herein relate to clock gating. An example integrated circuit includes an oscillator that outputs a clock signal to a clock gating system that generates and provides a gated clock signal to a data storage circuit. The clock gating system includes a first digital logic circuit having an input coupled to the oscillator to receive the clock signal, an active-low latch that includes an input coupled to an output of the first digital logic circuit and an input coupled to receive an enable signal, a second digital logic circuit that includes an input coupled to the oscillator and an input coupled to the output of the active-low latch, and an active-high latch that includes an input coupled to the output of the second digital logic circuit, an input coupled to receive the enable signal, and an output configured to provide a gated clock signal to the data storage circuit.

20 Claims, 5 Drawing Sheets

(56)  References Cited

U.S. PATENT DOCUMENTS

| | | |
|---|---|---|
| 2018/0224921 A1 | 8/2018 | Pant et al. |
| 2019/0212770 A1 | 7/2019 | Hashempour et al. |
| 2023/0003781 A1* | 1/2023 | Zhang .................... H03K 19/21 |
| 2024/0007087 A1* | 1/2024 | Hsu ........................ H03K 3/037 |

* cited by examiner

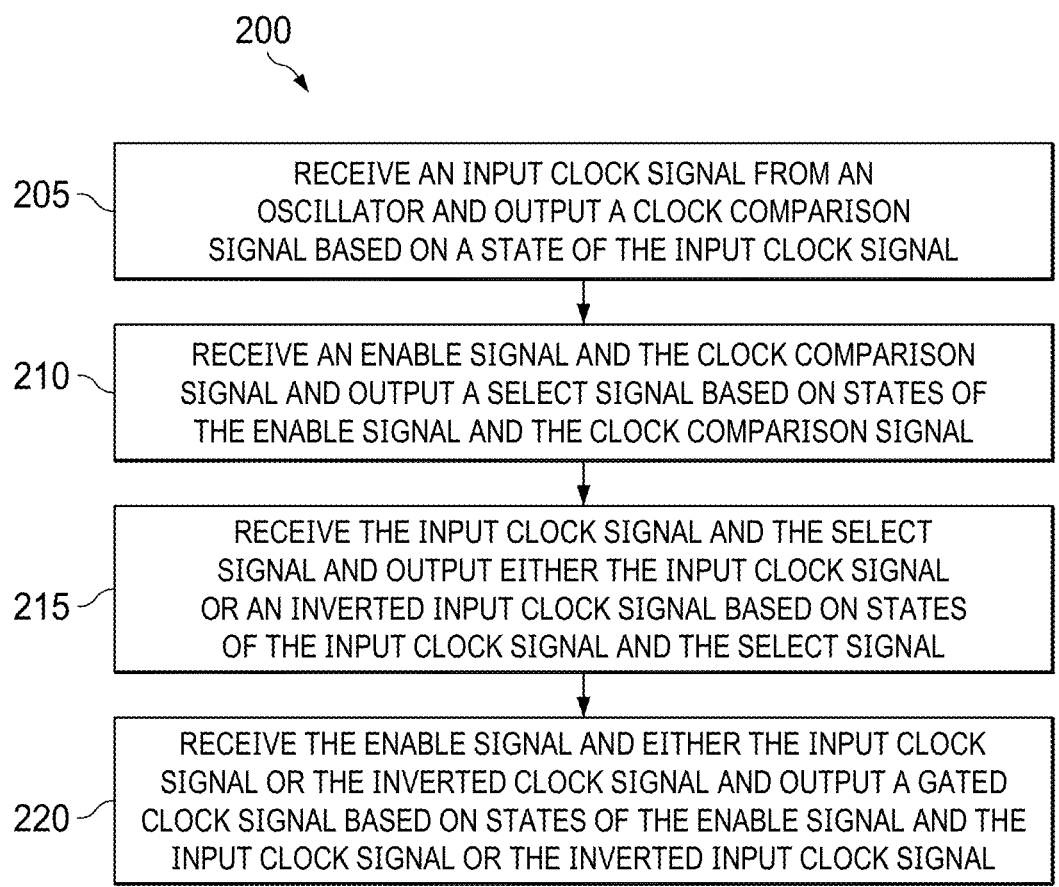

200

205 — RECEIVE AN INPUT CLOCK SIGNAL FROM AN OSCILLATOR AND OUTPUT A CLOCK COMPARISON SIGNAL BASED ON A STATE OF THE INPUT CLOCK SIGNAL

210 — RECEIVE AN ENABLE SIGNAL AND THE CLOCK COMPARISON SIGNAL AND OUTPUT A SELECT SIGNAL BASED ON STATES OF THE ENABLE SIGNAL AND THE CLOCK COMPARISON SIGNAL

215 — RECEIVE THE INPUT CLOCK SIGNAL AND THE SELECT SIGNAL AND OUTPUT EITHER THE INPUT CLOCK SIGNAL OR AN INVERTED INPUT CLOCK SIGNAL BASED ON STATES OF THE INPUT CLOCK SIGNAL AND THE SELECT SIGNAL

220 — RECEIVE THE ENABLE SIGNAL AND EITHER THE INPUT CLOCK SIGNAL OR THE INVERTED CLOCK SIGNAL AND OUTPUT A GATED CLOCK SIGNAL BASED ON STATES OF THE ENABLE SIGNAL AND THE INPUT CLOCK SIGNAL OR THE INVERTED INPUT CLOCK SIGNAL

FIG. 2

CLOCK GATING CIRCUITS AND METHODS FOR DUAL-EDGE-TRIGGERED APPLICATIONS

CROSS REFERENCE TO RELATED APPLICATIONS

This application is a continuation of and claims priority to U.S. application Ser. No. 18/308,486, filed Apr. 27, 2023, which is hereby incorporated herein by reference in its entirety.

TECHNICAL FIELD

This relates generally to clock-gating for data storage devices, and more particularly, to generating clock-gating signals to control dual-edge-triggered flip-flop devices.

BACKGROUND

In electronic systems including digital circuits and integrated circuits, clock signals produced by an oscillator can be used to synchronize functions of the circuitry. In essence, clock signals help circuits act or reset at the same time, which can improve performance of individual circuits and an electronic system overall. A clock signal is an electronic logic signal that transitions between a logical low state ("0") and a logical high state ("1") based on a duty cycle. During transitional periods between 0 and 1, or a rising edge, and between a 1 and 0, or a falling edge, circuitry can be triggered to become active.

In digital logic circuits, flip-flops and latches are circuits included to store state information and ensure proper sequencing for logic in electronics. Flip-flops switch states from 0 to 1 and 1 to 0 based on a clock signal. When switching states, flip-flops can store data, and consequently, consume power. However, digital circuits and components thereof, such as flip-flops and latches, are not always required to be active. Because, switching states consumes power, systems often employ clock gating to manage power consumption and conserve energy usage of digital circuits.

Clock gating refers to blocking the clock signal from reaching circuitry or allowing the clock signal to reach circuitry to disable or enable actions of the circuitry, respectively. Clock gating can use logical states of both the clock signal and an enable signal to generate a gated clock signal, which mimics the clock signal for certain periods of time when operation of a circuit is desired and suppresses transitions in the gated clock signal where operations is not desired. In conventional systems, clock gating circuits can be used to control single-edge-triggered flip-flops that operate (i.e., store data) based on either a transition from 0 to 1 (e.g., a positive-edge-triggered flip-flop) or transition from 1 to 0 (e.g., a negative-edge-triggered flip flop). Problematically, however, many existing clock gating techniques do not work with flip-flops that function on both types of transition, or both edges of the clock signal (e.g., dual-edge-triggered (DET) flip-flops). For example, clock gating circuits traditionally used with positive-edge-triggered flip-flops fail to provide a timely gated clock signal on some falling edges, which may cause latency or data misses in DET flip-flop applications. Similarly, clock gating circuits traditionally used with negative-edge-triggered flip-flops fail to provide a timely gated clock signal on some rising edges, which may cause latency or data misses in DET flip-flop applications.

SUMMARY

Various embodiments disclosed herein relate to clock gating systems, devices, and techniques, and more particularly, to generating a gated clock signal to control operation of a data storage device or system, such as a dual-edge-triggered flip-flop, during both rising and falling edge events (i.e., transitions from a logical low state to a logical high state and transitions from a logical high state to a logical low state, respectively) of a clock signal. In an example embodiment, an integrated circuit including an oscillator, a clock gating system, and a data storage circuit is provided. The oscillator is configured to output a clock signal. The clock gating system is coupled to the oscillator, and the data storage circuit is coupled to the clock gating system. The clock gating system includes a first digital logic circuit that includes a first input coupled to the oscillator to receive the clock signal, a second input, and an output, an active-low latch circuit that includes a first input coupled to the output of the first digital logic circuit, a second input coupled to receive an enable signal, and an output, a second digital logic circuit that includes a first input coupled to the oscillator to receive the clock signal, a second input coupled to the output of the active-low latch circuit, and an output, and an active-high latch circuit that includes a first input coupled to the output of the second digital logic circuit, a second input coupled to receive the enable signal, and an output configured to provide a gated clock signal. The data storage circuit includes a clock input coupled to the output of the active-high latch circuit to receive the gated clock signal.

This Summary is provided to introduce a selection of concepts in a simplified form that are further described below in the Detailed Description. It may be understood that this Summary is not intended to identify key features or essential features of the claimed subject matter, nor is it intended to be used to limit the scope of the claimed subject matter.

BRIEF DESCRIPTION OF THE DRAWINGS

FIG. 2 illustrates a series of steps for generating a gated clock signal via logic components in accordance with an embodiment.

The drawings are not necessarily drawn to scale. In the drawings, like reference numerals designate corresponding parts throughout the several views. In some embodiments, components or operations may be separated into different blocks or may be combined into a single block.

DETAILED DESCRIPTION

Figure 1:
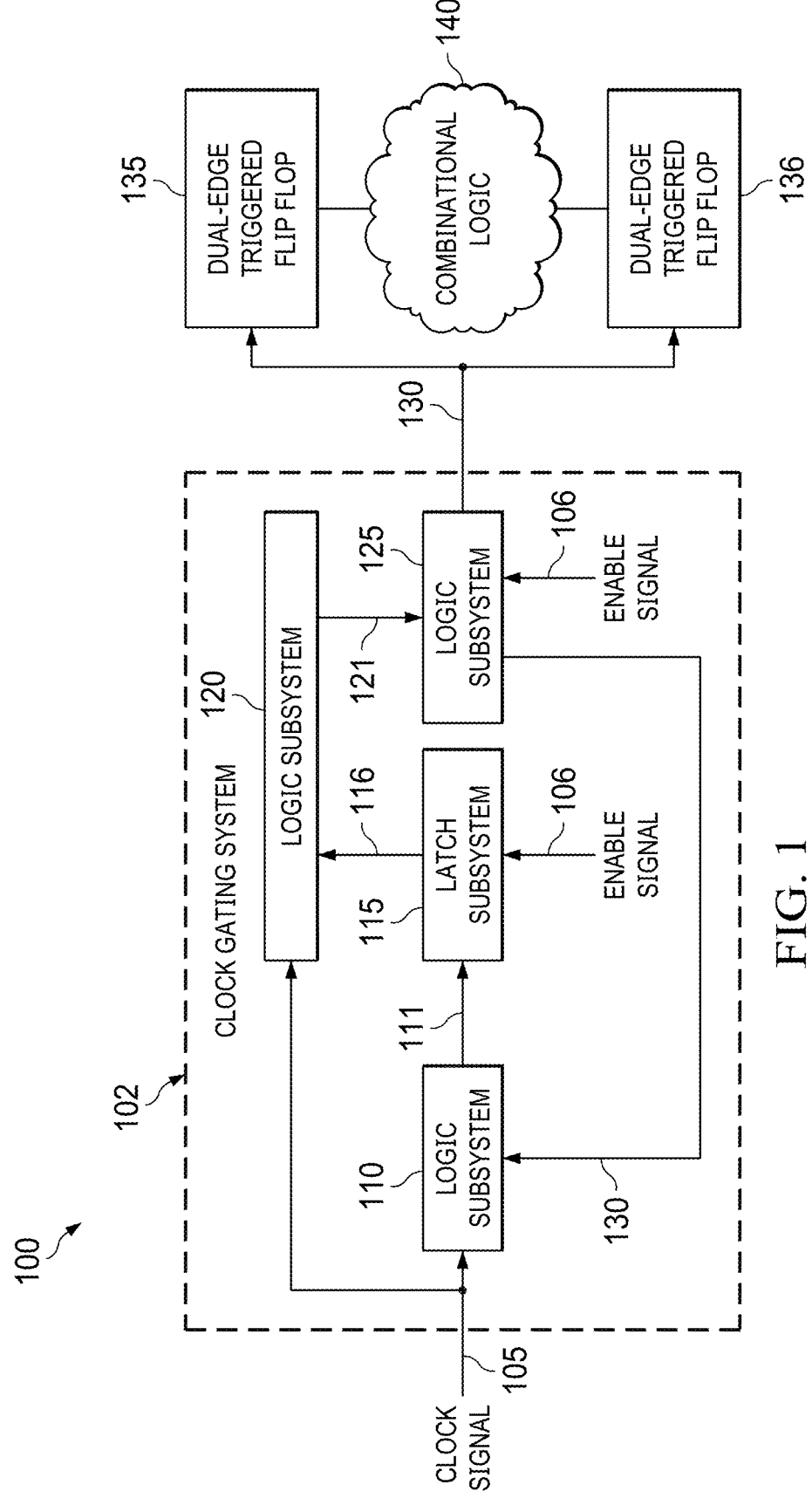
FIG. 1 illustrates an example clock gating system for performing clock gating processes in accordance with an embodiment.

Discussed herein are enhanced components, techniques, and systems related to clock gating, and more particularly, to generating a gated clock signal that toggles with every state transition of an input clock signal, such that a system including a dual-edge-triggered data storage circuit (e.g., a flip-flop, a latch) can use the gated clock signal to function without latency or missed state transitions. In an electronic system, a clock generation system can provide a clock signal to synchronize the actions of digital circuitry. Importantly, synchronizing digital circuitry allows digital circuitry components to perform sequential logic operations, among other functions. Often times, the clock signal used to control digital circuitry can be gated (e.g., prevented from transitioning) to stop the clock signal transitions from reaching associated circuitry and to thereby disable capture actions by the circuitry. Such techniques can be used for power management purposes as gating the clock signal prevents circuitry from performing some of the most energy intensive activity, and thus, clock gating techniques conserve power.

Flip-flops and latches are examples of logic components within digital circuitry that can be controlled via clock gating. Clock gating a digital circuit with a flip-flop, for example, prevents the flip-flop from switching states, and consequently, storing data (e.g., logic states) within the digital circuit. This can reduce the effective design frequency of the digital circuitry while maintaining throughput and saving power. Problematically, however, many existing clock gating solutions cannot be adapted for use in dual-edge-triggered (DET) flip-flops because of their different handling of rising and falling edges. DET flip-flops offer increased throughput in half the frequency as single-edge-triggered flip-flops (e.g., positive-edge-triggered flip-flops, negative-edge-triggered flip-flops) as DET flip-flops can switch states on both rising edge events and falling edge events of a clock signal.

As disclosed herein, a clock gating system can include a plurality of logic circuits, including two latching circuits configured to generate a gated clock signal that is either in-phase with an input clock signal (i.e., has the same value and transitions between states at the same time) or 180 degrees out-of-phase relative to the input clock signal (i.e., has the opposite value and transitions between states at the same time) at any time gating of digital circuitry is desired. Advantageously, such a clock gating system, and methods of clock gating for control of a dual-edge-triggered circuit, can be used with data storage circuits that are triggered on both positive edges and negative edges because the gated clock signal does not miss any rising or falling edge transitions between states. Not only does the gated clock signal output by the clock gating system allow data storage circuits to conserve power while providing additional throughput compared to data storage circuits that employ only single-edge-triggered techniques, but also the gated clock signal can reduce latency in synchronization among multiple data storage circuits of an electronic system.

In an example embodiment, an integrated circuit including an oscillator, a clock gating system, and a data storage circuit is provided. The oscillator is configured to output a clock signal. The clock gating system is coupled to the oscillator, and the data storage circuit is coupled to the clock gating system. The clock gating system includes a first digital logic circuit that includes a first input coupled to the oscillator to receive the clock signal, a second input, and an output, an active-low latch circuit that includes a first input coupled to the output of the first digital logic circuit, a second input coupled to receive an enable signal, and an output, a second digital logic circuit that includes a first input coupled to the oscillator to receive the clock signal, a second input coupled to the output of the active-low latch circuit, and an output, and an active-high latch circuit that includes a first input coupled to the output of the second digital logic circuit, a second input coupled to receive the enable signal, and an output configured to provide a gated clock signal. The data storage circuit includes a clock input coupled to the output of the active-high latch circuit to receive the gated clock signal.

In another example, a clock gating system that includes digital logic circuits and latch circuits is provided. The clock gating system includes a first digital logic circuit, an active-low latch circuit coupled to the first digital logic circuit, a second digital logic circuit coupled to the active-low latch circuit, and an active-high latch circuit coupled to the second digital logic circuit. The first digital logic circuit receives an input clock signal and provides a clock signal to the active-low latch circuit based on a state of the input clock signal. The active-low latch circuit receives the clock signal and an enable signal and provides a select signal to the second digital logic circuit based on states of the enable signal and the clock signal. The second digital logic circuit receives the select signal and the input clock signal and provides either the input clock signal or an inverted input clock signal to the active-high latch circuit based on states of the input clock signal and the select signal. The active-high latch circuit receives the enable signal and either the input clock signal or the inverted input clock signal and outputs a gated clock signal for control of a dual-edge-triggered flip-flop.

In yet another example, a method of generating a gated clock signal for control of a dual-edge-triggered storage device is provided. In the method, a first digital logic circuit receives an input clock signal and outputs a clock signal based on a state of the input clock signal. An active-low latch circuit receives an enable signal and the clock signal and outputs a select signal based on states of the enable signal and the clock signal. A second digital logic circuit receives the input clock signal and the select signal and outputs one of the input clock signal and an inverted input clock signal based on states of the input clock signal and the select signal. An active-high latch circuit receives the enable signal and one of the input clock signal and the inverted clock signal and outputs the gated clock signal based on states of the enable signal and the one of the input clock signal and the inverted input clock signal.

FIG. 1 illustrates an example integrated circuit device that includes a clock gating system for performing clock gating processes in accordance with an embodiment. FIG. 1 shows an example circuit device 100 that includes a clock gating system 102, which includes logic subsystem 110, latch subsystem 115, logic subsystem 120, and latch subsystem 125. The circuit device 100 may also include clock-driven devices such as dual-edge triggered flip flops 135 and 136 and may include various combinational logic 140 coupled between the clock-driven devices. The components of clock gating system 102 are configured to receive clock signal 105, perform logic (e.g., process 200 of FIG. 2), and generate gated clock signal 130 for control of digital circuitry. For example, circuit device 100 may also include clock-driven devices such as dual-edge trigger flip flops 135 and 136 that receive the gated clock signal 130, and the circuit device 100 may include various combinational logic 140 coupled between the clock-driven devices.

Clock signal 105 is representative of a signal generated and provided to clock gating system 102 by a clock generation circuit (not shown) having an oscillator. Clock signal 105 is a signal that toggles between a logical low state ("0" or "off") and a logical high state ("1" or "on"). The ratio of time in which clock signal 105 is in the high state versus the low state is referred to as the duty cycle. In various examples, the duty cycle of clock signal 105 is set to 50%, such that the signal is in a low state for the same amount of time that it is in a high state. In other words, a duty cycle of 50% means that the signal is on for 50% of a period, and the signal is off the other 50% of the period.

Clock signal 105 can be used to synchronize the timing of operations of digital circuitry such as dual-edge triggered flip flops 135 and 136 and combinational logic 140. However, digital circuitry is often not required to operate at all times, and thus, it is not always desirable to provide clock signal 105 to digital circuitry. Instead, clock gating system 102 can perform clock gating techniques to control the times that digital circuitry receives clock signal 105. Clock gating refers to preventing transitions of clock signal 105 from reaching circuitry or allowing transitions of clock signal 130 to reach circuitry to disable or enable capture actions by the circuitry, respectively. Gated clock signal 130 is representative of clock signal 105 in that it mimics the logical state and duty cycle of clock signal 105, but only for a limited duration based on clock gating logic. In other words, gated clock signal 130, rather than clock signal 105, can be output to digital circuitry to synchronize the digital circuitry at times determined by clock gating system 102.

Logic subsystem 110 is representative of one or more digital logic circuits (also referred as logic gates, devices, or components) configured to obtain clock signal 105 and gated clock signal 130 at inputs of logic subsystem 110 and produce an output (clock output 111) based on states (e.g., logical high state, logical low state) of clock signal 105 and gated clock signal 130. Clock signal 105 and gated clock signal 130 can be low or high at the same or at different times relative to each other. In various examples, logic subsystem 110 includes an XNOR logic gate, or one or more transistors capable of executing logic representative of an XNOR logic gate. Accordingly, when clock signal 105 and gated clock signal 130 have the same logical state (i.e., both high, both low), logic subsystem 110 can produce clock output 111 that has a value of "1," and when clock signal 105 and gated clock signal 130 do not have the same logical state (i.e., one is high and one is low), logic subsystem 110 can produce clock output 111 that has a value of "0".

Latch subsystem 115 is coupled to logic subsystem 110 and receives clock output 111 from logic subsystem 110 and enable signal 106 from a controller, or another computing device, of the clock generation circuit (not shown). Latch subsystem 115 is representative of one or more digital logic circuits configured to produce an output (select signal 116) based on states of clock output 111 and enable signal 106. Enable signal 106 is an electronic logic signal that can control clock gating processes based on its logical state. For example, when enable signal 106 is off, clock gating system 102 can gate clock signal 105, and when enable signal 106 is on, clock gating system 102 can disable clock gating.

In various examples, latch subsystem 115 includes an active-low latch circuit having multiple input pins and one output pin. The input pins may include a control pin and a data pin. The control pin controls the operation of latch subsystem 115, or, whether to store data or not. The data pin ingests input data that can be stored in latch subsystem 115 when the input at the control pin is in a high state. In various examples, enable signal 106 is supplied at the control pin of latch subsystem 115 and clock output 111 is supplied at the data pin of latch subsystem 115. This means that enable signal 106 controls data storage or latching functionality of latch subsystem 115 and that clock output 111 includes the state information that latch subsystem 115 can store. Based on the states of enable signal 106 and clock output 111, latch subsystem 115 can provide select signal 116 to logic subsystem 120.

Logic subsystem 120 is coupled to latch subsystem 115 and receives select signal 116 from latch subsystem 115 and clock signal 105 from the clock generation circuit (not shown). Logic subsystem 120 is representative of one or more digital logic circuits configured to produce an output (clock output 121) based on states of clock signal 105 and select signal 116. In an example, logic subsystem 120 includes an inverter (e.g., a NOT logic gate) and a multiplexer. The inverter and the multiplexer receive clock signal 105. The inverter also provides an inverted clock signal, or a signal with a logical state opposite relative to clock signal 105, to the multiplexer. The multiplexer selects and provides either clock signal 105 or the inverted clock signal as clock output 121 based on the states of clock signal 105 and select signal 116. In another example, logic subsystem 120 includes an XOR gate, or one or more transistors configured to execute logic representative of an XOR gate, that receives clock signal 105 and select signal 116 as inputs. In this example, when select signal 116 has a value of "1," logic subsystem 120 can produce clock output 121 with a value equal to that of the inverted clock signal. When select signal 116 has a value of "0," logic subsystem can produce clock output 121 with a value equal to that of clock signal 105.

Latch subsystem 125 is coupled to logic subsystem 120 and receives clock output 121 from logic subsystem 120 and enable signal 106 from the clock generation circuit. Latch subsystem 125 is representative of one or more digital logic circuits configured to produce gated clock signal 130 based on states of enable signal 106 and clock output 121. In various examples, latch subsystem 125 includes an active-high latch circuit having multiple pins and one output pin. Like the active-low latch circuit of latch subsystem 115, the input pins may include a control pin and a data pin, which can be configured to receive enable signal 106 and clock output 121, respectively. Thus, enable signal 106 controls data storage functionality of latch subsystem 125 and clock output 121 includes the state information of clock signal 105 that latch subsystem 125 can store.

Latch subsystem 125 can be further coupled to one or more downstream subsystems or devices like data storage circuits, such as dual-edge-triggered (DET) flip-flops 135 and 136, and other digital circuitry configured to operate using a clock signal (clock signal 105 or gated clock signal 130). Based on the states of enable signal 106 and clock output 121, latch subsystem 125 can output gated clock signal 130 at a logical state for use by the one or more downstream subsystems or devices. In the example illustrated in FIG. 1, DET flip-flops 135 and 136 can use gated clock signal 130 in operation of combinational logic 140. DET flip-flops 135 and 136 can perform combinational logic 140, which may include capture operations for example, based on transitions of gated clock signal 130 when gated clock signal 130 transitions with clock signal 105.

In operation, clock gating system 102 employs the logic of logic subsystem 110, latch subsystem 115, logic subsystem 120, and latch subsystem 125 to gate or provide a clock signal to one or more downstream subsystems. When enable signal 106 is "off", or in the logical low state, clock gating system 102 can operate in a clock-gating state where latch subsystem 125 outputs gated clock signal 130 with a steady value (i.e., "1" or "0") that does not mimic clock signal 105. This means the one or more downstream subsystems do not receive a toggling clock signal with which to operate. When enable signal 106 is "on", or in the logical high state, clock gating system 102 can operate in a non-clock-gating state where latch subsystem 125 outputs gated clock signal 130 that mimics clock signal 105 and its duty cycle. Under some circumstances, latch subsystem 125 outputs gated clock signal 130 with a value equal to the value of clock signal 105 and in-sync with clock signal 105 with respect to duty cycle. In other circumstances, latch subsystem 125 outputs gated clock signal 130 with a value opposite relative to the value of clock signal 105 but in-sync with clock signal 105 with respect to duty cycle. In other words, gated clock signal 130 is 180 degrees out-of-phase relative to clock signal 105. Regardless, the one or more downstream subsystems can use gated clock signal 130 as they would use clock signal 105 to operate.

Moving to FIG. 2, FIG. 2 illustrates a series of steps for generating a gated clock signal via logic components in accordance with an embodiment. FIG. 2 includes process 200 described parenthetically below, which references elements of FIG. 1. Process 200 can be implemented on fixed-purpose, dedicated hardware, programmable hardware, or a combination thereof. For example, process 200 can be executed on or by a clock gating system and digital logic components thereof, such as one or more components of clock gating system 102 of FIG. 1, or another apparatus, device, or system.

In operation 205, logic subsystem 110 receives (205) clock signal 105 from an oscillator of a clock generation circuit and outputs clock output 111 based, at least in part, on a state of the input clock signal 105. Clock signal 105 is a signal that toggles between "0," or "off," and "1," or "on," at a constant frequency and can be used to synchronize the timing of operations of digital circuitry. Logic subsystem 110 also receives gated clock signal 130 from latch subsystem 125. Like clock signal 105, gated clock signal 130 is a signal that either has a value of "0" or "1" or toggles between "0" and "1" consistently at the same frequency as clock signal 105. In other words, gated clock signal 130 can mimic the logical state of clock signal 105, or it can have a stable value of "0" or "1". Gated clock signal 130 can be used in place of clock signal 105 when clock gating of digital circuitry is desired and enabled in a clock gating system.

In various examples, logic subsystem 110 includes one or more digital logic circuits that can output clock output 111 based on the states (e.g., "0", "1") of clock signal 105 and gated clock signal 130. More specifically, logic subsystem 110 may include an XNOR logic gate. Accordingly, when clock signal 105 and gated clock signal 130 have the same logical state (i.e., both high, both low), logic subsystem 110 can produce clock output 111 that has a value of "1," and when clock signal 105 and gated clock signal 130 do not have the same logical state (i.e., one is high and one is low), logic subsystem 110 can produce clock output 111 that has a value of "0".

Next, in operation 210, latch subsystem 115 can receive (210) enable signal 106 from a clock generation circuit and clock output 111 from logic subsystem 110 and output select signal 116 based on states of enable signal 106 and clock output 111. Enable signal 106 is an electronic logic signal that can control clock gating processes based on its logical state. For example, when enable signal 106 is off, a clock gating system can gate clock signal 105 and provide downstream circuitry with gated clock signal 130 at a stable value ("0" or "1"), and when enable signal 106 is on, clock gating system 102 can disable clock gating and provide downstream circuitry with gated clock signal 130 that mimics clock signal 105.

In various examples, latch subsystem 115 includes an active-low latch circuit having multiple input pins and one output pin. The input pins may include a control pin and a data pin. The control pin controls the operation of latch subsystem 115, or, whether to store data or not. The data pin ingests input data that can be stored in latch subsystem 115 when the input at the control pin is in a high state. In various examples, enable signal 106 is supplied at the control pin of latch subsystem 115 and clock output 111 is supplied at the data pin of latch subsystem 115. This means that enable signal 106 controls data storage or latching functionality of latch subsystem 115 and that clock output 111 includes the state information that latch subsystem 115 can store. Based on the states of enable signal 106 and clock output 111, latch subsystem 115 can provide select signal 116 to logic subsystem 120.

In operation 215, logic subsystem 120 receives (215) clock signal 105 from a clock generation circuit and select signal 116 from latch subsystem 115 and outputs either clock signal 105 or an inverted clock signal (i.e., a signal having the same duty cycle but with a value opposite relative to the value of clock signal 105) based on states of clock signal 105 and select signal 116. In an example, logic subsystem 120 includes an inverter (e.g., a NOT logic gate) and a multiplexer. The inverter and the multiplexer receive clock signal 105. The inverter also provides the inverted clock signal to the multiplexer. The multiplexer selects and provides either clock signal 105 or the inverted clock signal as clock output 121 based on the states of clock signal 105 and select signal 116. In another example, logic subsystem 120 includes an XOR gate that receives clock signal 105 and select signal 116 as inputs. In this example, when select signal 116 has a value of "1," logic subsystem 120 can produce clock output 121 with a value equal to that of the inverted clock signal. When select signal 116 has a value of "0," logic subsystem can produce clock output 121 with a value equal to that of clock signal 105.

Lastly, in operation 220, latch subsystem 125 receives (220) enable signal 106 from a clock generation circuit and clock output 121 (i.e., either clock signal 105 or the inverted clock signal) from logic subsystem 120 and outputs gated clock signal 130 based on states of enable signal 106 and clock output 121. In various examples, latch subsystem 125 includes an active-high latch circuit having multiple pins and one output pin. Like the active-low latch circuit of latch subsystem 115, the input pins may include a control pin and a data pin, which can be configured to receive enable signal 106 and clock output 121, respectively. Thus, enable signal 106 controls data storage functionality of latch subsystem 125 and clock output 121 includes the state information of clock signal 105 that latch subsystem 125 can store. When enable signal 106 is in an "on" state, latch subsystem 125 may output gated clock signal 130 that mimics clock signal 105 to control and synchronize one or more downstream subsystems or devices, like data storage circuits (e.g., dual-edge-triggered (DET) flip-flops 135 and 136).

Figure 3A:
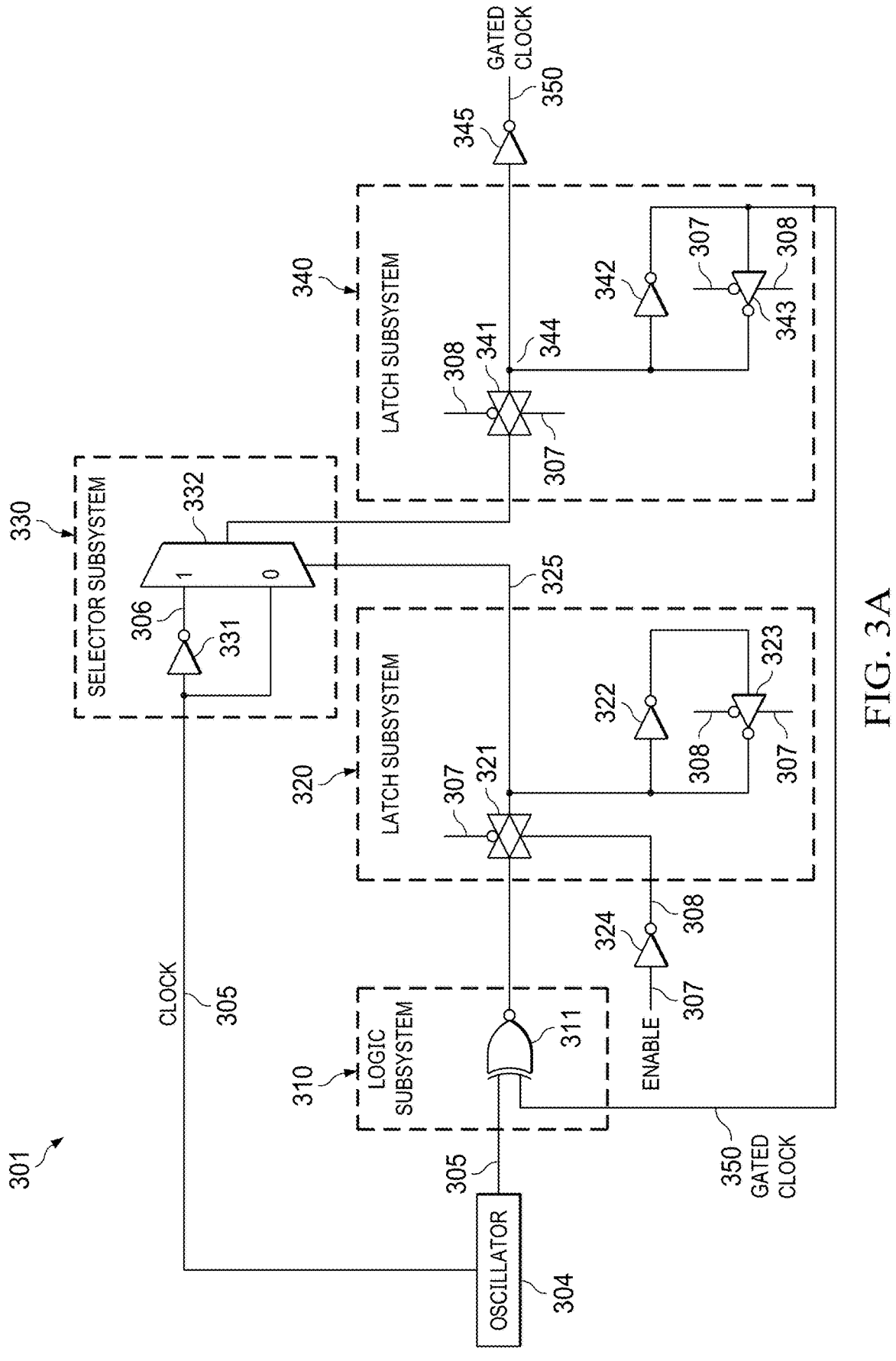
FIGS. 3A and 3B illustrate example operating architectures configurable to perform clock gating for control of circuitry in accordance with an embodiment.
Figure 3B:
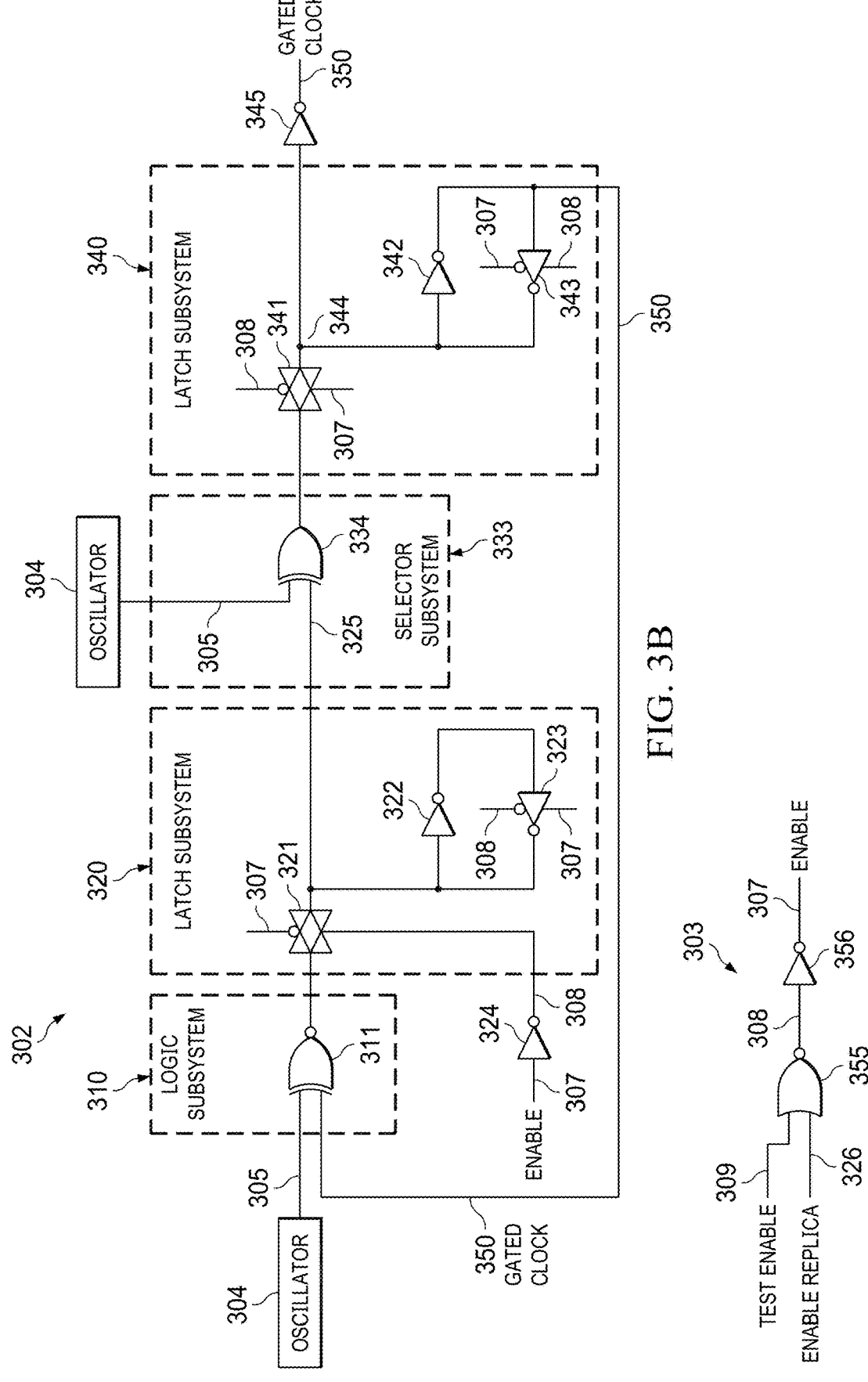

FIGS. 3A and 3B illustrate example operating architectures configurable to perform clock gating for control of circuitry in accordance with an embodiment. FIG. 3A shows operating architecture 301. FIG. 3B shows operating architectures 302 and 303. Operating architectures 301 and 302 each include oscillator 304, logic subsystem 310, latch subsystem 320, selector subsystem 330, and latch subsystem 340. Operating architecture 303 includes logic gates that may be added to or replace components of operating architectures 301 and 302. The elements included in operating architectures 301, 302, and 303 may be representative of subsystems and components used in a clock gating system, such as clock gating system 102 of FIG. 1, and may be configurable to perform clock gating processes, such as process 200 of FIG. 2.

Operating architectures 301 and 302 include various digital logic circuits, components, and devices (e.g., logic gates, transistors), which can be configured to gate clock signals or provide clock signals generated by oscillator 304 to downstream subsystems, including digital circuits and data storage circuits (e.g., flip-flops, latches). More specifically, logic subsystem 310, latch subsystem 320, selector subsystem 330, and latch subsystem 340 are made of one or more such circuits, components, and devices and include one or more inputs and outputs to provide logical state values to one another. Logic subsystem 310 can be coupled to an output of a clock generation circuit, such as oscillator 304, and an input of latch subsystem 320. Latch subsystem 320 can be coupled to an output of logic subsystem 310, an output of the clock generation circuit, and an input of selector subsystem 330. Selector subsystem 330 can be coupled to an output of latch subsystem 320, an output of the clock generation circuit, and an input of latch subsystem 340. Latch subsystem 340 can be coupled to an output of selector subsystem 330 and an output of the clock generation circuit.

Referring first to operating architecture 301 of FIG. 3A, logic subsystem 310 may be an example of logic subsystem 110 and may include XNOR logic gate 311. XNOR logic gate 311 receives clock 305 and gated clock 350 as inputs. Both clock 305 and gated clock 350 have logical state values at a given time. For example, clock 305 and gated clock 350 can be low or high at the same or at different times relative to each other. When clock 305 and gated clock 350 have the same logical state (i.e., both high, both low), logic subsystem 310 can produce an output that has a value of "1". When clock 305 and gated clock 350 do not have the same logical state (i.e., one is high and one is low), logic subsystem 310 can produce an output that has a value of "0". Logic subsystem 310 can feed this output as an input to latch subsystem 320.

Latch subsystem 320 may be an example of latch subsystem 115 and may include active-low latch 321 representative of a latch circuit that can output values based on a state of the latch circuit. Active-low latch 321 may include a control pin configured to receive enable 307 and a data pin configured to receive the output from logic subsystem 310. The control pin can control latching functionality of active-low latch 321, while the data pin can control the output value from active-low latch 321. Active-low latch 321 may also receive inverted enable 308 from inverter 324. Inverter 324 may represent a NOT logic gate. Inverter 324 is fed enable 307 and provides inverted enable 308, or a value opposite relative the value of enable 307, to active-low latch 321. The output of active-low latch 321 can be fed through inverter 322 and tristate inverter 323, and ultimately, to selector subsystem 330.

In a state of active-low latch 321 when enable 307 provides an "off" or a "low" logical value (i.e., gated state), active-low latch 321 can output select signal 325 that toggles with every transition of clock 305. In other words, active-low latch 321 does not latch or store a single state value based on the state of the output from logic subsystem 310 that is coupled to the data pin of active-low latch 321. Rather, active-low latch 321 can output select signal 325 having the same transitions as clock 305 and either the same value as clock 305 (in-phase) or the opposite value relative to the value of clock 305 at a given time (180 degrees out-of-phase). In another state of active-low latch 321 when enable 307 transitions from "off" to "on" and provides an "on" or a "high" logical value (i.e., non-gated state), active-low latch 321 can store the last state value provided to active-low latch 321 at the data pin (from logic subsystem 310) and output select signal 325 having the same value as the last state value (i.e., either "0" or "1") that does not toggle with every transition of clock 305. In this state, active-low latch 321 can store and output this value until enable 307 is "off."

Next, selector subsystem 330, which may be an example of logic subsystem 120, receives select signal 325 from latch subsystem 320 and clock 305 from the clock generation circuit. In operating architecture 301, selector subsystem 330 includes inverter 331 and multiplexer 332. Inverter 331 receives clock 305 and provides inverted clock 306 having a value opposite the value of clock 305 to multiplexer 332. Multiplexer 332 receives clock 305, inverted clock 306, and select signal 325 and is configured to select and output either clock 305 or inverted clock 306 based on the value, or state, of select signal 325. In various examples, when select signal 325 has a value of "1," multiplexer 332 can output inverted clock 306, and when select signal 325 has a value of "0," multiplexer 332 can output clock 305. In this way, when enable 307 transitions from "0" to "1," gated clock 350 can toggle between "0" and "1" with every transition of clock 305.

Latch subsystem 340, which may be an example of latch subsystem 125 receives enable 307 from a clock control system (e.g., a controller of or external to the clock generation circuit) and either clock 305 or inverted clock 306 from multiplexer 332 and outputs latch gated clock 344, and consequently, gated clock 350, based on states of enable 307 and clock 305. In this example, latch subsystem 340 includes active-high latch 341, representative of a latch circuit, inverter 342, and tristate inverter 343. Active-high latch 341 may include a control pin configured to receive enable 307 and a data pin configured to receive the output from multiplexer 332 (i.e., clock 305 or inverted clock 306). Active-high latch 341 may also receive inverted enable 308, such as from an inverter gate (not shown). The output of active-high latch 341, latch gated clock 344, can be fed through inverters 342 and 343, and to logic subsystem 310 via inverter 342, and also to inverter 345 to produce gated clock 350.

In a state of active-high latch 341 when enable 307 is "on" (i.e., non-gated state), active-high latch 341 can output latch gated clock 344 having the same transitions as clock 305 and either the same value as clock 305 or the same value as inverted clock 306 (i.e., 180 degrees out-of-phase with respect to clock 305) at a given time. Latch gated clock 344 can be fed to inverter 345, representative of a NOT logic gate, to produce gated clock 350. In this state, gated clock 350 mimics or mirrors clock 305 and can be fed to one or more downstream subsystems (not shown) to allow the subsystems to perform in synchronization with gated clock 350. Additionally, gated clock 350 can also be fed back to an input of logic subsystem 310. In another state of active-high latch 341 when enable 307 is "off" (i.e., gated state), active-high latch 341 can store the last state value provided to active-high latch 341 at the data pin (from multiplexer 332) and output latch gated clock 344 having the same value as the last state value (i.e., either "0" or "1") that does not toggle with every transition of clock 305. In this state, active-high latch 341 can store and output this value until enable 307 is "on." Similarly, active-high latch 341 can provide latch gated clock 344 to inverter 345, which can invert the state value and produce gated clock 350 that has only a single, stable value. Due to gated clock 350 not toggling with every transition of clock 305, any downstream subsystems coupled to the clock gating system represented by operating architecture 301 may not perform at least some functionality that requires a toggling clock signal.

Referring next to FIG. 3B, operating architecture 302 includes oscillator 304, logic subsystem 310, latch subsystem 320, selector subsystem 333, and latch subsystem 340 and is configured to produce gated clock 350 based on states of various inputs and outputs to and from the aforementioned subsystems. However, in operating architecture 302, selector subsystem 333, which may be another example of logic subsystem 120, may be included in place of selector subsystem 330 and include XOR logic gate 334. XOR logic gate 334 can receive clock 305 and select signal 325 as inputs and produce an output based on states of clock 305 and select signal 325. Accordingly, when select signal 325 inputs a value of "1," XOR logic gate 334 can output a value equal to that of an inversion of clock 305 (e.g., inverted clock 306). When select signal 325 inputs a value of "0," XOR logic gate 334 can output a value equal to that of clock 305.

Operating architecture 303 includes NOR gate 355 and inverter 356. NOR gate 355 includes two inputs. At a first input, NOR gate 355 receives test enable 309, and at a second input, NOR gate 355 receives enable replica 326. Enable replica 326 may be a signal having the same logical state as enable 307 at a given time. Test enable 309 is representative of a signal having a logical high state or a logical low state that can control the state of enable 307, and consequently, the operation of the components of operating architectures 301 and 302. For example, when test enable 309 is in a logical high state, NOR gate 355 and inverter 356 can provide enable 307 to latch subsystem 320 and latch subsystem 340 with a logical state that causes gated clock 350 to toggle with every transition of clock 305. When test enable 309 is in a logical low state, the state of enable 307 (by way of enable replica 326) can control operations of the components of operating architecture 301 and 302.

In various examples, NOR gate 355 and inverter 356 can be coupled to latch subsystem 320 in place of inverter 324 in operating architectures 301 and 302. Regardless of the choice of components, the clock gating system represented by operating architectures 301, 302, and 303 can be used to enable clock gating techniques usable by data storage circuitry, such as dual-edge-triggered (DET) flip-flops. This is possible due to, at least in part, the use of both active-low latch and active-high latch logic. In a non-gated state, when enable 307 is "on," an active-low latch (e.g., active-low latch 321) can hold select signal 325 to a stable, non-toggling value while an active-high latch (e.g., active-high latch 341) downstream in the system relative to the active-low latch can produce an output that toggles like clock 305 without missing any transitions of clock 305 (i.e., no latency). In a gated state, when enable 307 is "off," the active-low latch can produce select signal 325 that toggles like clock 305 without missing any transitions of clock 305 to prepare the system for a state change of enable 307, which would trigger the system to operate in the non-gated state. Meanwhile, the active-high latch can hold latch gated clock 344, and consequently, gated clock 350 to a stable, non-toggling value, such that when enable 307 does change states to "on," the active-high latch can begin outputting latch gated clock 344 and gated clock 350 that toggle with clock 305 without missed transitions. While latch gated clock 344 and gated clock 350 may be in-phase or out-of-phase with clock 305 at a given time, or during a period of time in the non-gated state, the phase does not impact the functionality of downstream DET flip-flops because DET flip-flops latch using both positive and negative edges of a signal.

Figure 4:
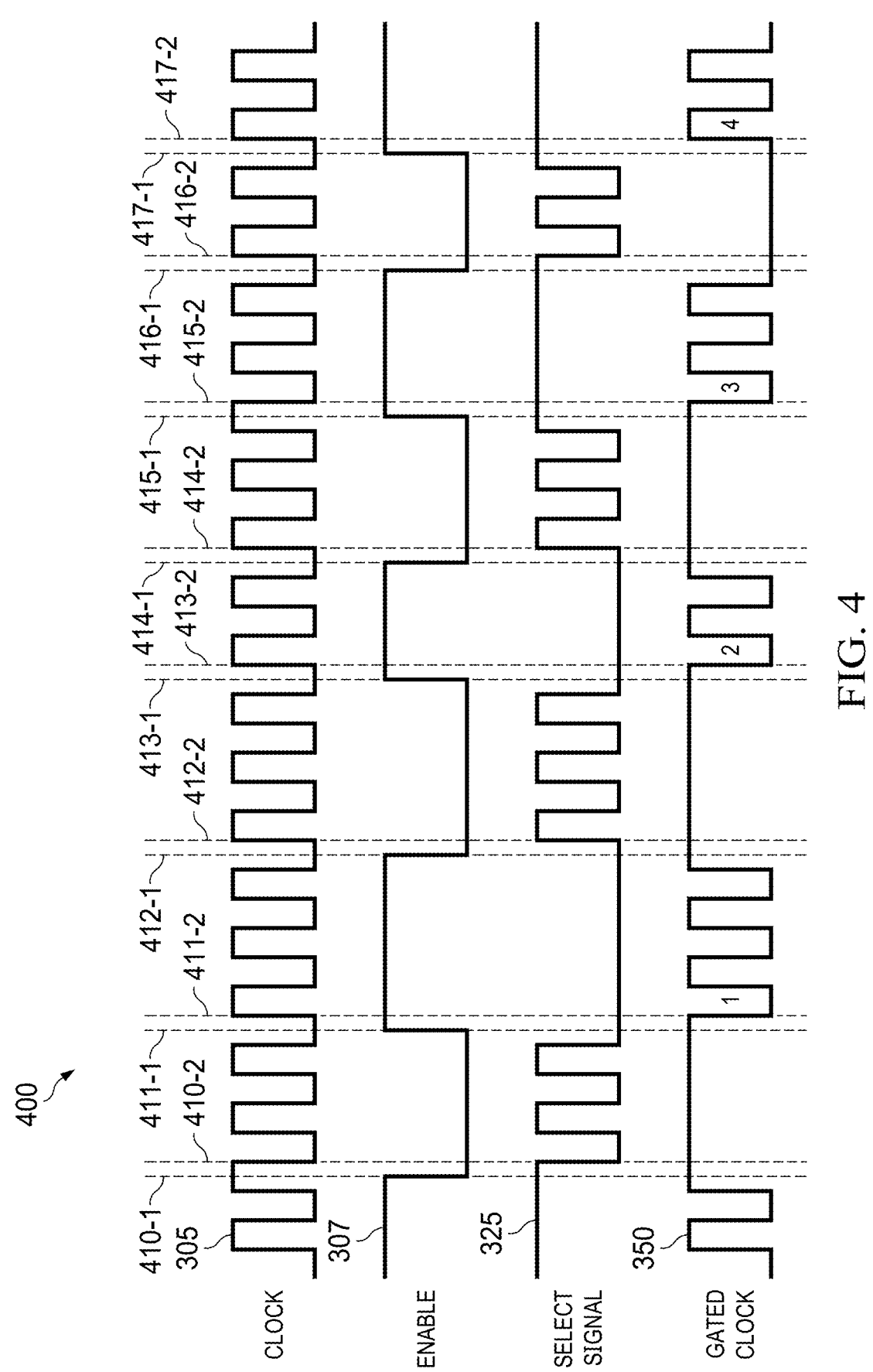
FIG. 4 illustrates an example timing diagram of signals of a clock gating system in accordance with an embodiment.

FIG. 4 illustrates an example timing diagram of a clock gating system in accordance with an embodiment. FIG. 4 shows timing diagram 400, which includes logical representations, such as logical high states and logical low states, and references elements of FIGS. 3A, 3B, and 3C. For example, timing diagram 400 can demonstrate example states of input and output signals of subsystems of a clock gating system, such as clock gating system 102 of FIG. 1, and/or components of operating architectures 301, 302, and 303 of FIGS. 3A, 3B, and 3C, respectively.

Timing diagram 400 includes digital waveforms associated with clock 305, enable 307, select signal 325, and gated clock 350. The digital waveforms demonstrate states of the signals, such as a logical high state ("on") and a logical low state ("off"). The logical high state is illustrated as a horizontal line in a higher position relative to the position of the logical low state. It follows that the logical low state is illustrated as a horizontal line in a lower position relative to the position of the logical high state. Vertical lines that connect the horizontal lines are considered rising edges if the transition is from the logical low state to the logical high state or falling edges if the transition is from the logical high state to the logical low state. For reference, at the point at which the waveforms begin in timing diagram 400 (leftmost point in FIG. 4), clock 305 is in the logical low state, enable 307 is in the logical high state, select signal 325 is in the logical high state, and gated clock 350 is in the logical low state.

Time 410-1 illustrates a first time when enable 307 transitions from the logical high state to the logical low state. In other words, enable 307 turns off, which means the clock gating system transitions to a clock-gated state. At time 410-1, clock 305, select signal 325, and gated clock 350 are all in the high logical state. Because clock 305 and gated clock 350 are both on, their values equal one another (i.e., both have a value of "1"), and logic subsystem 310 can provide an output with a value of "1" to latch subsystem 320. Based on receiving a value of "1" from logic subsystem 310 and receiving a value of "0" associated with enable 307, latch subsystem 320 can output select signal 325 mimicking clock 305 to selector subsystem 330. Based on select signal 325 and clock 305, selector subsystem 330 can output inverted clock signal 306 to latch subsystem 340. However, because enable 307 turns off at time 410-1, latch subsystem 340 stores the last value of gated clock 350 at time 410-1 ("1") and outputs that value until enable 307 turns back on. Accordingly, at time 410-2, representative of a time after one inversion, such as a portion of the duty cycle of clock 305, clock 305 and select signal 325 transition to the logical low state simultaneously and gated clock 350 remains at the logical high state.

Time 411-1 illustrates a first time when enable 307 transitions from the logical low state to the logical high state. At time 411-1, clock 305 and select signal 325 are in the low logical state and gated clock 350 remains in the high logical state. Because clock 305 and gated clock 350 are in opposite states, their values do not equal one another, and logic subsystem 310 outputs a value of "0" to latch subsystem 320. When enable 307 turns on, latch subsystem 320 stores the last value of select signal 325 at time 411-1 ("0") and outputs select signal 325 at "0" until enable 307 turns back off. Thus, selector subsystem 330 receives a "0" from latch subsystem 320. Based on receiving select signal 325 in the logical low state, selector subsystem 330 outputs clock 305 to latch subsystem 340. Latch subsystem 340 identifies that enable 307 is on and outputs latch gated clock 344 mimicking clock 305 based on receiving clock 305 from selector subsystem 330. Latch gated clock 344 can then be inverted (i.e., by inverter 345) to produce gated clock 350 that is 180 degrees out-of-phase and toggles with every transition of clock 305. As can be seen, by producing the gated clock 350 in an out-of-phase orientation, no transitions of the clock

305 are missed after the enable signal 307 is asserted. Accordingly, at time 411-2, representative of a time after one inversion, clock 305 transitions to the logical high state and gated clock 350 transitions to the logical low state simultaneously and begin to toggle together, while select signal 325 remains in the logical low state.

Time 412-1 represents a second time when enable 307 transitions from the logical high state to the logical low state. At time 412-1, clock 305 and gated clock 350 are in opposite states and select signal 325 remains in the logical low state. Because clock 305 and gated clock 350 are in opposite states, logic subsystem 310 outputs a value of "0" to latch subsystem 320. Latch subsystem 320 can receive the value of "0" from logic subsystem 310 and enable 307 having a value of "0" and output select signal 325 with values and transitions mimicking clock 305 based on the inputs. Latch subsystem 340 also receives enable 307 having a value of "0" and stores the last value of gated clock 350 at time 412-1 ("1") and outputs that value until enable 307 turns back on. Accordingly, at time 412-2, representative of a time after one inversion, clock 305 and select signal 325 transition to the logical high state simultaneously and gated clock 350 remains at the logical high state.

Time 413-1 illustrates a second time when enable 307 transitions from the logical low state to the logical high state. At time 413-1, clock 305 and select signal 325 are in the logical low state and gated clock 350 is in the logical high state. Because clock 305 and gated clock 350 are in opposite states, logic subsystem 310 outputs a value of "O" to latch subsystem 320. When enable 307 turns on, latch subsystem 320 stores the last value of select signal 325 at time 413-1 ("0") and outputs select signal 325 at "0" until enable 307 turns back off. Thus, selector subsystem 330 receives a "0" from latch subsystem 320. Based on receiving select signal 325 in the logical low state, selector subsystem 330 outputs clock 305 to latch subsystem 340. Latch subsystem 340 identifies that enable 307 is on and outputs latch gated clock 344 mimicking clock 305 based on receiving clock 305 from selector subsystem 330. Latch gated clock 344 can then be inverted (i.e., by inverter 345) to produce gated clock 350 that is 180 degrees out-of-phase and toggles with every transition of clock 305. Accordingly, at time 413-2, representative of a time after one inversion, clock 305 and gated clock 350 toggle and mirror each other while select signal 325 remains at the logical low state.

Time 414-1 illustrates a third time when enable 307 transitions from the logical high state to the logical low state. At time 414-1, clock 305 and gated clock 350 are in opposite states and select signal 325 remains in the logical low state. Because clock 305 and gated clock 350 are in opposite states, logic subsystem 310 outputs a value of "0" to latch subsystem 320. Latch subsystem 320 can receive the value of "0" from logic subsystem 310 and enable 307 having a value of "0" and output select signal 325 with values and transitions mimicking clock 305 based on the inputs. Latch subsystem 340 also receives enable 307 having a value of "0" and stores the last value of gated clock 350 at time 414-1 ("1") and outputs that value until enable 307 turns back on. Accordingly, at time 414-2, representative of a time after one inversion, clock 305 and select signal 325 transition to the logical high state simultaneously and gated clock 350 remains at the logical high state.

Time 415-1 illustrates a third time when enable 307 transitions from the logical low state to the logical high state. At time 415-1, clock 305, select signal 325, and gated clock 350 are all in the logical high state. Therefore, logic subsystem 310 outputs a value of "1" to latch subsystem 320.

Latch subsystem 320 receives a "1" from a clock generation circuit based on enable 307 being turned on. Latch subsystem 320 stores the last value of select signal 325 at time 415-1 ("1") and outputs select signal 325 with that value until enable 307 turns off. Selector subsystem 330 receives select signal 325 in the high logical state and clock 305, and based on the states of these inputs, selector subsystem 330 outputs inverted clock 306 to latch subsystem 340. Latch subsystem 340 identifies that enable 307 is on and outputs latch gated clock 344 mimicking inverted clock 306 based on receiving inverted clock 306 from selector subsystem 330. Latch gated clock 344 can then be inverted (i.e., by inverter 345) to produce gated clock 350 that is in-phase and toggles with every transition of clock 305. Accordingly, at time 415-2, representative of a time after one inversion, clock 305 and gated clock 350 transition from the logical high state to the logical low state simultaneously and begin to toggle together, while select signal 325 remains in the logical high state.

Time 416-1 illustrates a fourth time when enable 307 transitions from the logical high state to the logical low state. At time 416-1, clock 305 and gated clock 350 are in the same state (logical low state) and select signal 325 remains in the logical high state. Because clock and gated clock 350 are in the same state, logic subsystem 310 outputs a value of "1" to latch subsystem 320. Latch subsystem 320 can receive the value of "1" from logic subsystem 310 and the value of "0" associated with enable 307 and output select signal 325 that transitions from the logical high state to the logical low state and begins to toggle 180 degrees out-of-phase relative to clock 305. Latch subsystem 340 also receives enable 307 having a value of "O" and stores the last value of gated clock 350 at time 416-1 ("0") and outputs that value until enable 307 turns back on. Accordingly, at time 416-2, representative of a time after one inversion, clock 305 and select signal 325 transition to opposite states simultaneously and gated clock 350 remains at the logical low state.

Time 417-1 illustrates a fourth time when enable 307 transitions from the logical low state to the logical high state. At time 417-1, clock 305 and gated clock 350 are in the logical low state and select signal 325 is in the logical high state. Therefore, logic subsystem 310 outputs a value of "1" to latch subsystem 320. Latch subsystem 320 receives a "1" from a clock generation circuit based on enable 307 being turned on. Latch subsystem 320 stores the last value of select signal 325 at time 417-1 ("1") and outputs select signal 325 with that value until enable 307 turns off. Selector subsystem 330 receives select signal 325 in the high logical state and clock 305, and based on the states of these inputs, selector subsystem 330 outputs inverted clock 306 to latch subsystem 340. Latch subsystem 340 identifies that enable 307 is on and outputs latch gated clock 344 mimicking inverted clock 306 based on receiving inverted clock 306 from selector subsystem 330. Latch gated clock 344 can then be inverted (i.e., by inverter 345) to produce gated clock 350 that is in-phase and toggles with every transition of clock 305. Accordingly, at time 417-2, representative of a time after one inversion, clock 305 and gated clock 350 transition from the logical low state to the logical high state simultaneously and begin to toggle together, while select signal 325 remains in the logical high state.

Various other combinations and variations of logical states and transitions between logical states can occur in a clock gating system disclosed herein. Importantly, however, when enable 307 is in the logical low state, it can be seen that select signal 325 can transition between states with clock 305, whether in- or out-of-phase with clock 305, and can be provided to latch subsystem 340. Accordingly, when enable 307 transitions to the logical high state, latch subsystem 340 can use clock 305 or inverted clock 306, based on the current state of select signal 325, to generate gated clock 350 that also transitions between states with clock 305 without missing any rising or falling edges of clock 305.

While some examples provided herein are described in the context of a clock gating system, subsystem, component, device, architecture, or environment, it should be understood that the clock gating systems, logic subsystems, and other systems and methods described herein are not limited to such embodiments and may apply to a variety of other processes, systems, applications, devices, and the like. As will be appreciated by one skilled in the art, aspects of the present invention may be embodied as a system, method, computer program product, and other configurable systems. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for" but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A device, comprising:
   a clock gating system comprising:
      a first digital logic circuit that includes a first input configured to receive a clock signal, a second input, and an output;
      a first latch circuit that includes a first input coupled to the output of the first digital logic circuit, a second input configured to receive an enable signal, and an output;
      a second digital logic circuit that includes a first input configured to receive the clock signal, a second input coupled to the output of the first latch circuit, and an output; and
      a second latch circuit that includes a first input coupled to the output of the second digital logic circuit, a second input configured to receive the enable signal, and an output coupled to the second input of the first digital logic circuit and configured to provide a gated clock signal; and a dual-edge triggered flip-flop that includes an input coupled to the output of the second latch circuit.

2. The device of claim 1, wherein the first digital logic circuit comprises an XNOR digital logic gate.

3. The device of claim 1, wherein the first latch circuit comprises an active-low latch circuit.

4. The device of claim 1, wherein the second digital logic circuit comprises an inverter digital logic gate and a multiplexer coupled to an output of the inverter digital logic gate.

5. The device of claim 4, wherein the inverter digital logic gate includes an input, in addition to the output, that is coupled to the first input of the second digital logic circuit, and wherein the multiplexer includes a first input coupled to the input of the inverter digital logic gate, a second input coupled to the output of the inverter digital logic gate, a third input coupled to the second input of the second digital logic circuit, and an output.

6. The device of claim 1, wherein the second digital logic circuit comprises an XOR digital logic gate.

7. The device of claim 1, wherein the second latch circuit comprises an active-high latch circuit.

8. A system, comprising:

a first digital logic circuit;

a first latch circuit coupled to the first digital logic circuit;

a second digital logic circuit coupled to the first latch circuit; and a second latch circuit coupled to the second digital logic circuit, wherein the first digital logic circuit is configured to receive an input clock signal and provide an output signal based on a state of the input clock signal;

wherein the first latch circuit is configured to receive an enable signal at a control pin of the first latch circuit, receive the output signal at a data pin of the first latch circuit, and provide, based on states of the enable signal and the input clock signal, a select signal;

wherein the second digital logic circuit is configured to receive the input clock signal, receive the select signal, and provide, based on states of the input clock signal and the select signal, one of the input clock signal or an inverted input clock signal; and wherein the second latch circuit is configured to receive the enable signal at a control pin of the second latch circuit, receive the one of the input clock signal or the inverted input clock signal at a data pin of the second latch circuit, and output, based on states of the enable signal and the one of the input clock signal or the inverted input clock signal, a gated clock signal.

9. The system of claim 8, wherein the second latch circuit is further configured to provide the gated clock signal to the first digital logic circuit, and wherein the first digital logic circuit is configured to provide the output signal based further on the gated clock signal.

10. The system of claim 8, wherein the first digital logic circuit comprises an XNOR digital logic gate.

11. The system of claim 8, wherein the first latch circuit comprises an active-low latch circuit.

12. The system of claim 8, wherein the second digital logic circuit comprises an inverter digital logic gate and a multiplexer coupled to an output of the inverter digital logic gate.

13. The system of claim 12, wherein the inverter digital logic gate configured to receive the input clock signal at an input and generate an inverted input clock signal at the output, and wherein the multiplexer configured to receive the input clock signal at a first input, configured to receive the inverted input clock signal at a second input, receive the select signal at a third input, and provide the one of the input clock signal or the inverted input clock signal an output based on the select signal.

14. The system of claim 8, wherein the second digital logic circuit comprises an XOR digital logic gate.

15. The system of claim 8, wherein the second latch circuit comprises an active-high latch circuit.

16. The system of claim 8, wherein the gated clock signal is provided to a dual-edge triggered flip-flop.

17. A method, comprising:

generating, by a first digital logic circuit, a first output signal based on an input clock signal and an output clock signal, wherein the output clock signal represents a gated version of the input clock signal;

generating, by a first latch circuit, a select signal based on an enable signal and the first output signal;

generating, by a second digital logic circuit, a second output signal based on the input clock signal and the select signal;

generating, by a second latch circuit, the output clock signal based on the enable signal and the second output signal; and providing the output clock signal to a dual-edge triggered flip-flop.

18. The method of claim 17, wherein the first digital logic circuit comprises an XNOR digital logic gate.

19. The method of claim 17, wherein the first latch circuit comprises an active-low latch circuit, and the second latch circuit comprises an active-high latch circuit.

20. The method of claim 17, wherein the second digital logic circuit comprises an inverter digital logic gate and a multiplexer coupled to an output of the inverter digital logic gate, or an XOR digital logic gate.

* * * * *